United States Patent [19]

Shikata

[11] Patent Number: 5,393,680
[45] Date of Patent: Feb. 28, 1995

[54] MIS ELECTRODE FORMING PROCESS

[75] Inventor: Shin-ichi Shikata, Yokohama, Japan

[73] Assignee: Sumitomo Electric Industries, Ltd., Osaka, Japan

[21] Appl. No.: 736,967

[22] Filed: Jul. 30, 1991

[30] Foreign Application Priority Data

Aug. 1, 1990 [JP] Japan .................................. 2-204529
Aug. 1, 1990 [JP] Japan .................................. 2-204531

[51] Int. Cl.$^6$ .................. H01L 21/285; H01L 21/336; H01L 21/306
[52] U.S. Cl. ...................................... 437/40; 437/184; 437/235; 437/241; 437/946
[58] Field of Search ............... 437/241, 946, 225, 236, 437/237, 235, 184, 40

[56] References Cited

U.S. PATENT DOCUMENTS

| | | | |
|---|---|---|---|
| 4,320,178 | 3/1982 | Chemla et al. | 437/237 |
| 4,751,200 | 6/1988 | Gmitter et al. | 437/225 |
| 4,751,201 | 6/1988 | Nottenburg et al. | 437/225 |
| 4,871,692 | 10/1989 | Lee et al. | 437/235 |
| 4,920,078 | 4/1990 | Bagley et al. | 437/225 |

FOREIGN PATENT DOCUMENTS

| | | | |
|---|---|---|---|
| 0265314 | 4/1988 | European Pat. Off. | 437/237 |
| 0469604 | 2/1992 | European Pat. Off. | |
| 0469605 | 2/1992 | European Pat. Off. | |
| 0469606 | 2/1992 | European Pat. Off. | |
| 62-31170 | 2/1987 | Japan . | |
| 62-94944 | 5/1987 | Japan . | |
| 2-284420 | 11/1990 | Japan | 437/236 |
| 3-11633 | 1/1991 | Japan | 437/237 |

OTHER PUBLICATIONS

Shikata et al., "Formation of Submicron Silicon-Nitride Patterns by Lift-Off Method Using ECR-CVD", SPIE vol. 797 Advanced Processing of Semiconductor Devices, 1987, pp. 126–129.
Iyer et al., "Role of Polysulfides in the Passivation of the InP Surface", Appl. Phys. Lett., vol. 59, No. 4, 22 Jul. 1991, pp. 437–439.
Matsuo et al., "Low Temperature Chemical Vapor Deposition Method Utilizing an Electron Cyclotron Resonance Plasma," Jap. J. of Appl. Physics, vol. 22, No. 4, Apr. 1983, pp. L210–L212.
Shikata et al., "Photoluminescence Studies on Over-Passivations of $(NH_4)_2S_x$-treated GaAs," J. Appl. Phys., vol. 70, No. 7, Oct. 1, 1991, pp. 3721–3725.
Weiguo, "Interface of Anodic Sulfide-Oxide on n-type InSb", Appl. Phys. A, vol. 52, 1991, pp. 75–77.
Neudeck et al, "Significant Long-Term Reduction in n-channel MESFET Subthreshold Leakage Using Ammonium-Sulfide Surface Treated Gates," IEEE Electron Device Letters, Oct. 1991, vol. 12, No. 12, pp. 553–555.
Sandroff, "Chemical Passivation of Compound Semiconductor Surfaces: Applications, Mechanisms and In Situ Probes", Extended Abstracts of the 1991 International Conference on Solid State Devices and Materials, Yokohama, 1991, p. 273.
Iyer et al., "Preparation and Characterization of Polysulfide Treated InP MIS Structures," Third Int'l. Conf. Indium Phosphide and Related Materials, IEEE, 1991, pp. 621–625.
Lau et al., "In Situ X-ray Photoelectron Spectroscopic Study of Remote Plasma Enhanced Chemical Vapor Deposition of Silicon Nitride on Sulfur Passivated InP", J. Vac. Sci. Technol. B, vol. 8, No. 4 Jul./Aug. 1990, pp. 848–855.

*Primary Examiner*—Mary Wilczewski
*Attorney, Agent, or Firm*—Beveride, DeGrandi, Weilacher & Young

[57] ABSTRACT

There is disclosed a process for forming a MIS electrode by forming an insulation film on a substrate of a III-V compound semiconductor, and applying an electrode material thereto, a surface of the substrate being treated with a phosphoric acid-based etchant and selenium or sulfur-passivated, and then an insulation film being formed.

4 Claims, 4 Drawing Sheets

MIS ELECTRODE FORMING PROCESS

BACKGROUND OF THE INVENTION 1. (Field of the Invention)

This invention relates to a process for forming a MIS (metal-insulator-semiconductor) type structure electrode.

2. (Related Background Art)

It is essential for MIS type structure electrodes that the interface states density between the semiconductors and the insulation layer is low. For the improvement of their characteristics, Japanese Patent Laid-Open Publication Nos. 31170/1987 and 94944/1987 were proposed. GaAs semiconductors generally have interface states densities in the order of $10^{13} cm^{-2} eV^{-1}$ because of the difficulty of reconstructing dangling bonds on the interfaces. This is higher by about three orders, compared with the interface states density between silicon and silicon dioxide of MOS-FETs.

But recently it has been noted that ammonia sulfide $(NH_4)_2 S_x$ containing excessive sulfur is used in sulfur passivation. Specifically, in Jia-Fa FAN, et.al., "Marked Reduction the Surface/Interface States of GaAs by $(NH_4)_2 S_x$ Treatment" (Japanese Journal of Applied Physics, Vol. 28, No. 12 (December 1989), pp. L2255-L2257) it is confirmed that the interface states density on $GaAs/SiO_2$ is reduced to $1.2 \times 10^{11} cm^{-2} eV^{-1}$.

MIS FETs having good characteristics such as the interface states density which is higher by one order, compared with that of Si-system MOS FETs, can not be produced even by the use of this treatment. The inventors have made studied and found that a process for forming a MIS electrode which has succeeded in greatly decreasing the interface states density.

SUMMARY OF THE INVENTION

The inventors have completed this invention based on studies on the results of the surface treatment of III-V compound semiconductors with various etchants prior to the sulfur passivation.

Specifically, a first invention of the present application relates to a process for forming a MIS type structure by forming an insulator layer on a substrate of a III-V compound semiconductor, and forming an electrode material thereon, the surface of the substrate being slightly etched with a phosphoric acid-based etchant prior to the formation of the insulation layer.

It is possible that the III-V compound semiconductor contains at least either of gallium and arsenic. According to the first invention, prior to the sulfur passivation, the surface layer of the substrate is etched off with an isotropic etchant, such as a phosphoric acid-based etchant. Consequently the interface between the III-V compound semiconductor, and the insulation layer is reformed to reduce dangling bonds, and it is possible to decrease the interface states density.

That is, a second invention of the present application relates to a process for forming a MIS type structure electrode by forming an insulator layer on a III-V semiconductor substrate, and then applying an electrode material thereto, the surface of the substrate being passivated by sulfur reaction prior to the formation of the insulation layer, and the insulation layer being formed by ECR-CVD.

The insulation layer is a SiN film and, after formed, may be heat-treated at 380° to 520° C.

In this invention, the insulation layer is deposited after the sulfur passivation by ECR-CVD, which give little damages the substrate. Consequently the effect of decrease in dangling bonds on the interface between a III-V compound semiconductor and the insulation layer is not degraded, with the result that the interface states density can be decreased.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art form this detailed description.

DESCRIPTION OF THE PREFERRED EMBODIMENT

Figure 1A:
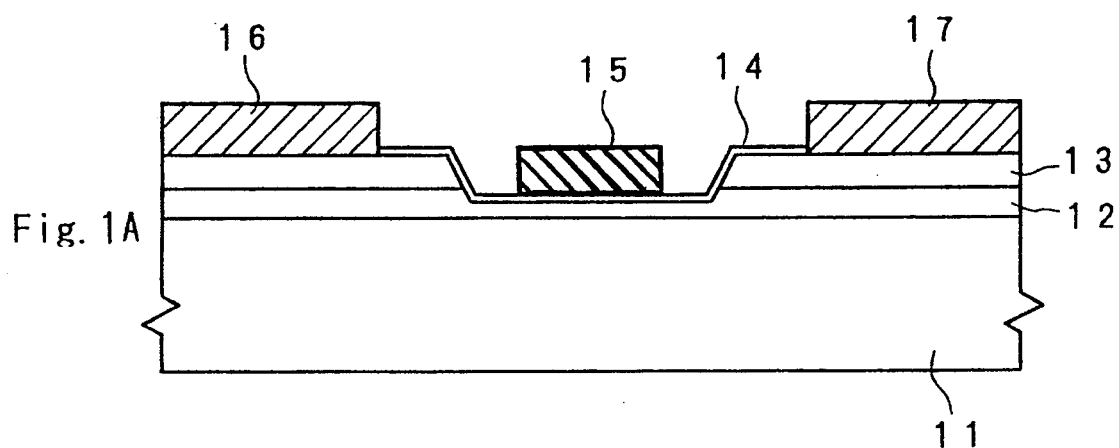
FIGS. 1A and 1B are respectively sectional views of a MISFET the process of one embodiment according to this invention.
Figure 1B:
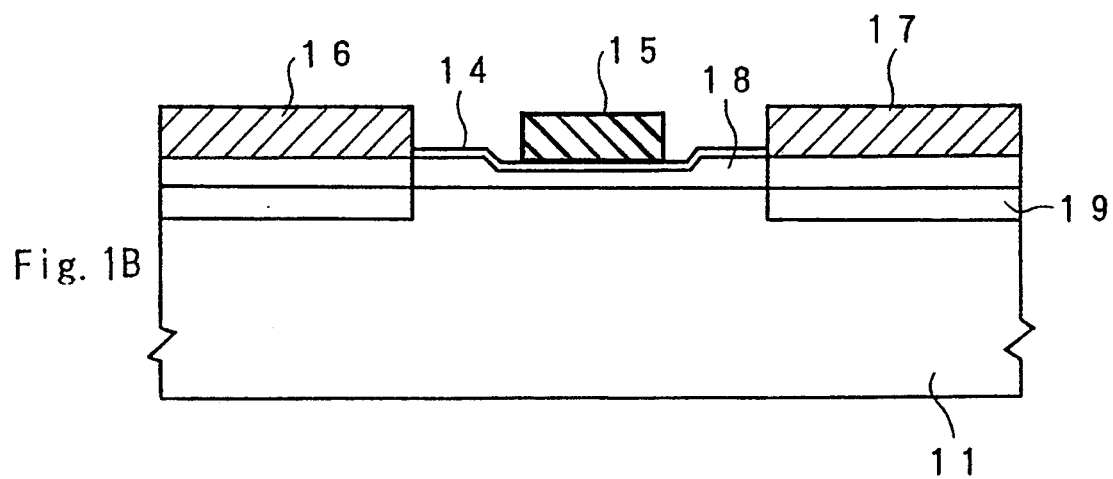

FIGS. 1A and 1B show the structures of a MISFET which the process according to this invention is applied to. FIG. 1A shows a III-V group compound semiconductor substrate formed by epitaxial growth, and FIG. 1B shows a III-V compound semiconductor substrate formed by ion implantation. In the FET of FIG. 1A, first a $p^-$-GaAs substrate 11 is prepared. On this substrate an $n^-$-GaAs layer 12 and $n^-$-GaAs layer 13 are formed sequentially by OMVPE. Then that of the $n^-$-GaAs layer 13 in a channel region of the FET is selectively etched off, and the $n^-$-GaAs is exposed. Then the treatment with a phosphoric acid-based etchant which characterizes this invention, is performed, and the surface of the $n^-$-GaAs layer 12 is etched thin. At this time, the $n^-$-GaAs layer 13 is also lightly etched without resultantly causing problems. Next, the sulfur passivation is performed with $(NH_4)_2 S_x$ solution or the like. Then an insulation layer 14 is formed. After annealing, a gate electrode 15, a source electrode 16, and a drain electrode 17 are formed, and the MISFET of FIG. 1A is fabricated.

In MISFET of FIG. 1B, a $p^-$-GaAs substrate 11 is prepared, and by ion implantation an $n^-$-GaAs layer 18 as an active layer, an $n^+$-GaAs layer 19 as a contact layer are formed. Next a channel region of the FET is etched off so as to form a recess structure. Then the treatment with a phosphoric acid-based etchant and the sulfur passivation both of which characterize this invention follow. These treatments are the same as in FIG. 1A. Then an insulation layer 14 is formed. After annealing a gate electrode 15, and a source electrode 16 and a drain electrode 17 are formed. And the MISFET of FIG. 1B is fabricated.

The inventors compared, in the intensity of photoluminescence, the effects of the treatment with various etchants, which is performed prior to the sulfur passivation.

Figure 2:
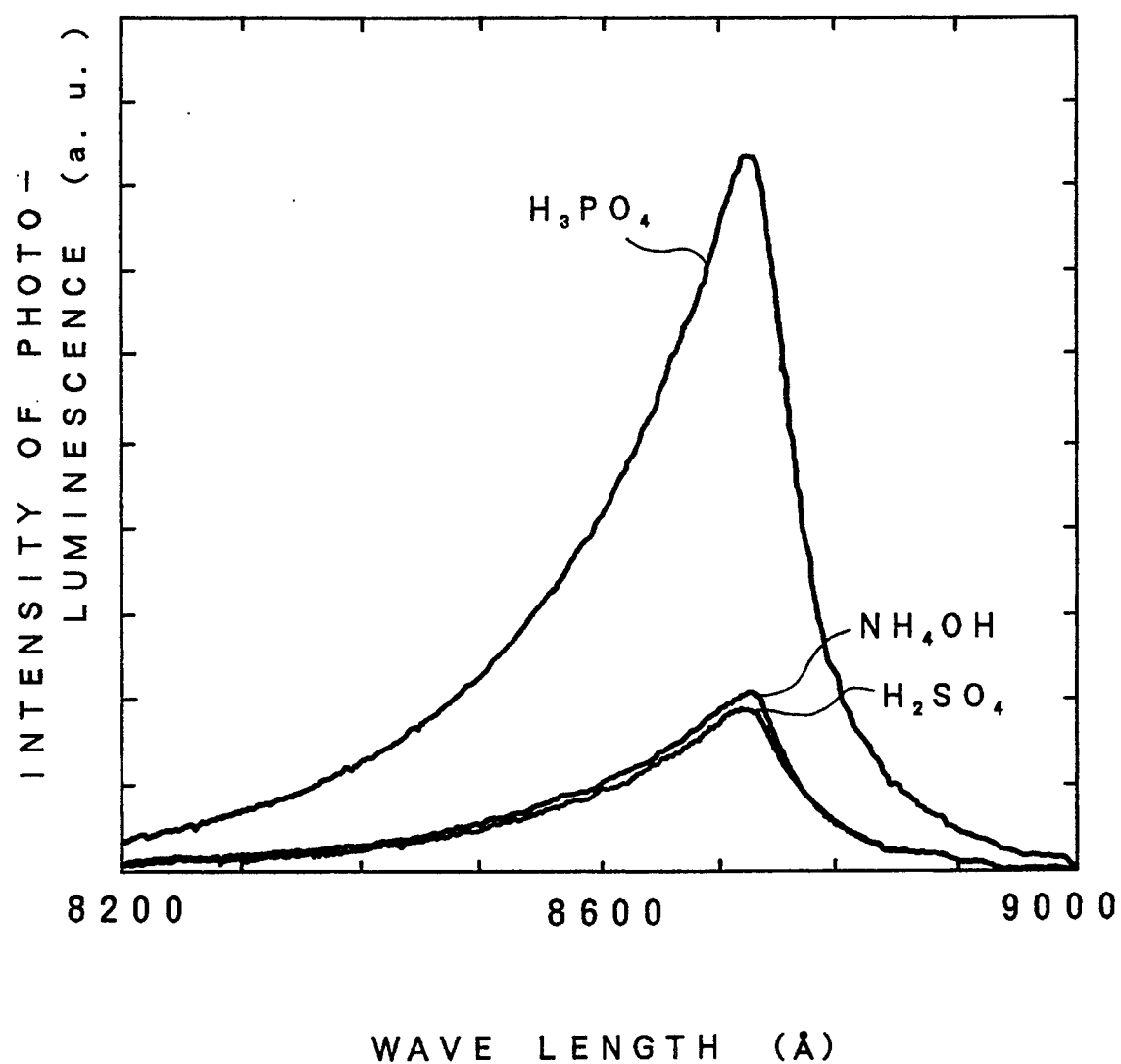
FIG. 2 is a graph showing the effect of the treatment with a phosphoric acid-based etchant.

The result of the comparison is shown in FIG. 2. As seen in FIG. 2, when lightly etched with a phosphoric acid-based etchant, the wavelength corresponding to the bandedge has higher PL intensity. In contrast to this, when etched with the so-called anisotropic etchants, such as ammonia- and sulfuric acid-based etchants, no great improvement is made. Here the normal mesa etchants mean those which etch surfaces in inversed and normal mesas. Phosphoric acid-based etchants etch surfaces in generally normal mesas in any direction and are called here isotropic etchants.

The inventors test-fabricated a MISFET for the confirmation of the advantageous effects of this invention.

EXAMPLE 1

A $p^-$-GaAs substrate is prepared, and an $n^-$GaAs layer and an $n^+$-GaAs layer were grown on the substrate by OMVPE respectively in a thickness of 1000 angstroms (Å) and 700 Å. That of the $n^+$-GaAs in a gate opening was removed and, after the mask was removed, lightly etched with the phosphoric acid-based etchant of

$H_3PO_4:H_2O_2:H_2O=4:1:100.$

Then the whole was immersed in a solution of $(NH_4)_2S_x$ ($1 \leq x \leq 3$) for 10 minutes, and then water-cleaned for 20 seconds and dehydrated by nitrogen gas blow. Next, an SiN film was formed by ECR-CVD process and heat-treated at 450° C. for 30 minutes. Then a gate electrode, a source electrode and a drain electrode were formed. Interface states density was measured on this MISFET by high-frequency C-V measurements, and the measured density was $6 \times 10^{10} cm^{-2} eV^{-1}$.

EXAMPLE 2

A p-GaAs substrate was prepared, and on this substrate an $n^-$GaAs layer and an $n^+$-GaAs layers were formed by ion implantation. Then as in Example 1, the treatment with a phosphoric acid-based etchant, and the sulfur passivation were performed. And a MISFET was fabricated. Interface states density was measured on this MISFET by high-frequency C-V measurements. The density was $9 \times 10^{10} cm^{-2} eV^{-1}$. This higher interface states density than that in Example 1 will be because epitaxial growth increases crystallization.

Comparison 1

The etching treatment was performed with an $NH_4OH$ based etchant in place of a phosphoric acid-based etchant. And an insulation layer was formed of $SiO_2$ by resistance heating. The other conditions were the same as in Example 1. Interface states density was measured on this MISFET by high-frequency C-V measurements. The density was $1.2 \times 10^{11} cm^{-2} eV^{-1}$.

For reference, the inventors compared PL (photoluminescence) intensities in layers obtained by various film forming processes.

Figure 3:
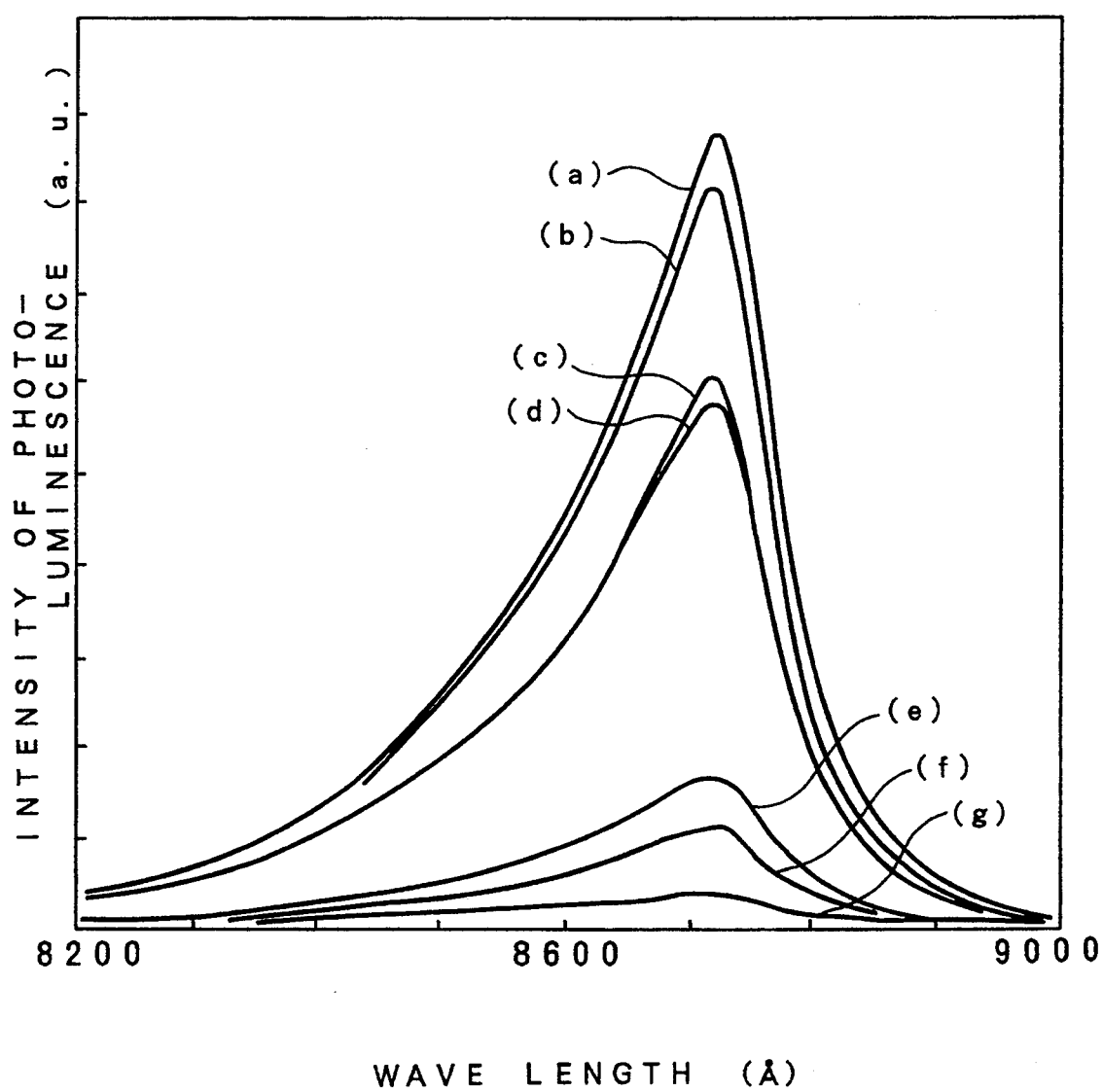
FIG. 3 is a graph showing differences in intensity of photoluminescence (PL) among various film forming processes.

The result is shown in FIG. 3. Curve (a) in FIG. 3 is the result of the case in which the sulfur passivation was followed by the insulation layer formation by ECR-CVD. High PL intensity was obtained at the band edge. Curve (b) in FIG. 3 is the result of the case in which the sulfur passivation was performed, but no insulation layer was formed. These show that the use of ECR-CVD does not reduce the effect of the sulfur passivation at all. This will be the reason why the ECR-CVD apparatus has a plasma generation chamber and the film forming chamber for a substrate to be set in separated from each other, and plasma shower does not damage the surface of GaAs semiconductors.

Curve(c) shows the result of sputter, and Curve (d) shows the result of the pyrolytic CVD. These show that the effect of the sulfur passivation is retained, and in comparison with ECR-CVD, however, the effect is degraded. Curve (e) shows the result of plasma CVD at RF of 13.56 MHz, and Curve (g) shows the result of the case in which an insulation layer was formed by plasma CVD at RF of 50 KHz. These show that the effect of the sulfur passivation is much degraded. Curve (f) shows the result of the case in which no treatment was performed.

Next, the inventors checked the influence of annealing following the formation of the insulation layer 14.

Figure 4:
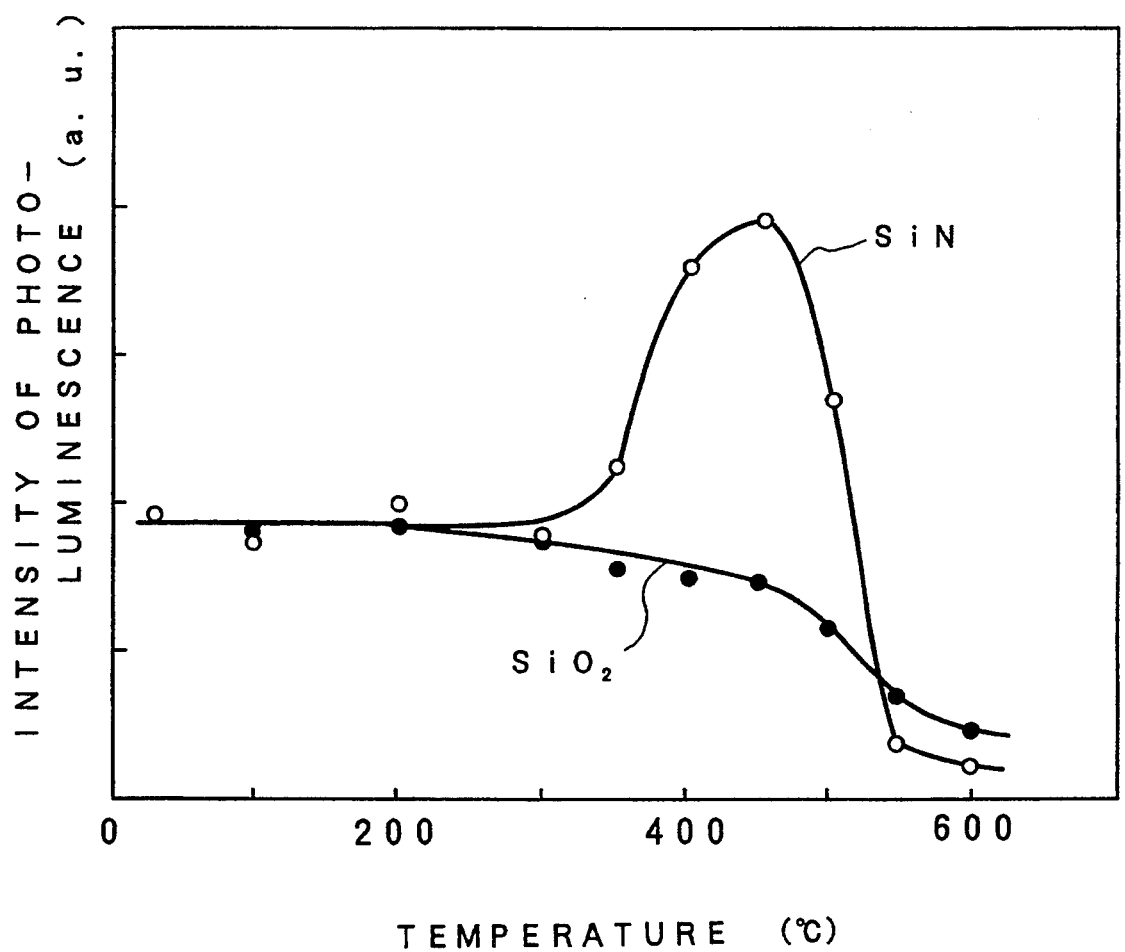
FIG. 4 is a graph showing annealing effect.

FIG. 4 shows the result. The SiN film formed by ECR-CVD had improved PL intensity when annealed at 380° to 520° C., especially 400° to 500° C. In contrast to this, $SiO_2$ film had the PL intensity unimproved by annealing. The annealing was conducted for 30 minutes in nitrogen gas surrounding atmosphere.

In the above embodiment, sulfur passivation treatment is applied to a surface of the semiconductor after etching treatment with a phosphoric acid-based etchant. Selenium is one element of a group VI in which sulfur is included and therefore has chemical properties similar to that of sulfur. Further, atomic radius of selenium is nearer to those of Ga and As than that of sulfur and therefore it is possible that selenium surface layer has lower energy level than that of sulfur surface layer and as the result is more stable than that of sulfur. See Journal of Applied physics Vol. 67 No. 1, Jan. 1, 1990, pages 586 to 588, "Enhanced electronic properties of GaAs surface chemically passivated by selenium reactions". In view of the above the passivation treatment using selenium can be applied to the surface of the semiconductor substrate instead of the sulfur passivation treatment of the above embodiment and the advantageous effect in the surface states density which is obtained by the sulfur passivation may be also obtained by the selenium passivations. As described above, according to this invention, the surface layer of a substrate is etched off with an isotropic etchant, such as a phosphoric acid-based etchant, prior to the sulfur passivation. Consequently the interface between a III-V compound semiconductor, and an insulation layer is reformed to reduce dangling bonds, and the interface states density can be reduced. Accordingly the resultant MIS electrode has good characteristics.

From the invention thus described, it will be obvious that the invention may be varied in many ways. Such variations are not to be regarded as a departure from the spirit and scope of the invention, and all such modifications as would be obvious to one skilled in the art are intended to be included within the scope of the following claims.

I claim:

1. A process for forming a MIS electrode, comprising:

sulfur-passivating a predetermined area on a surface of a III-V compound semiconductor substrate;

forming an insulation film on said predetermined area by ECR-CVD;

applying an electrode material to said insulation film; and heat-treating said insulation film at a temperature between 380° C. and 520° C.

2. A process for forming a MIS electrode according to claim 1, wherein said III-V compound semiconductor contains at least one of gallium and arsenic.

3. A process for forming a MIS electrode, comprising:

sulfur-passivating a predetermined area on a surface of a III-V compound semiconductor substrate;

forming an insulation film by depositing SiN by ECR-CVD on said predetermined area;

applying an electrode material to said insulation film; and heat-treating said insulation film at a temperature between 380° C. and 520° C.

4. A process for forming a MIS electrode according to claim 3, wherein said III-V compound semiconductor contains at least one of gallium and arsenic.

* * * * *